United States Patent
Jomaa et al.

(10) Patent No.: US 8,017,022 B2
(45) Date of Patent: Sep. 13, 2011

(54) SELECTIVE ELECTROLESS PLATING FOR ELECTRONIC SUBSTRATES

(75) Inventors: Houssam Jomaa, Phoenix, AZ (US);
Omar J. Bchir, Phoenix, AZ (US);
Islam Salama, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 927 days.

(21) Appl. No.: 11/966,396

(22) Filed: Dec. 28, 2007

(65) Prior Publication Data

US 2009/0166320 A1 Jul. 2, 2009

(51) Int. Cl.
*H01B 13/00* (2006.01)
(52) U.S. Cl. .......................................... 216/17; 438/940
(58) Field of Classification Search .................... 216/17, 216/37, 39, 63, 65, 66, 58, 75, 94; 438/690, 438/694, 700, 706, 940; 156/272.8; 264/400, 264/482; 134/22.17, 25.1
See application file for complete search history.

(56) References Cited

U.S. PATENT DOCUMENTS

| | | | |
|---|---|---|---|
| 5,462,897 A * | 10/1995 | Baum et al. ...................... | 216/18 |
| 6,190,493 B1 * | 2/2001 | Watanabe et al. ............. | 156/300 |
| 6,632,372 B1 * | 10/2003 | Chen et al. ...................... | 216/13 |
| 2007/0144769 A1 * | 6/2007 | Salama ........................... | 174/260 |
| 2007/0153488 A1 * | 7/2007 | Yang et al. ..................... | 361/748 |
| 2008/0070329 A1 * | 3/2008 | Jomaa et al. ..................... | 438/13 |
| 2009/0108455 A1 * | 4/2009 | Gurumurthy et al. ......... | 257/762 |

FOREIGN PATENT DOCUMENTS

| | | | |
|---|---|---|---|
| JP | 05-166939 | * | 2/1993 |
| JP | 2005-166939 | | 7/1993 |

OTHER PUBLICATIONS

Machine translation of JP 5-166939 with fig. 1.*
International Search Report for corresponding matter, mailed Nov. 25, 2008.

* cited by examiner

*Primary Examiner* — Nadine G Norton
*Assistant Examiner* — Patti Lin
(74) *Attorney, Agent, or Firm* — David L. Guglielmi

(57) ABSTRACT

In some embodiments, selective electroless plating for electronic substrates is presented. In this regard, a method is introduced including forming a film on a surface of a substrate, the film designed to prevent the seeding of an electroless plating catalyst, laser ablating the surface of the substrate through the film to form trenches, and seeding the surface of the substrate with an electroless plating catalyst. Other embodiments are also disclosed and claimed.

9 Claims, 2 Drawing Sheets

SELECTIVE ELECTROLESS PLATING FOR ELECTRONIC SUBSTRATES

FIELD OF THE INVENTION

Embodiments of the present invention generally relate to the field of integrated circuit package substrates, and, more particularly to selective electroless plating for electronic substrates.

BACKGROUND OF THE INVENTION

Reductions in the size and pitch of integrated circuit devices require advancements in the manufacture of IC package substrates. The use of lasers is becoming more common for patterning substrates. Metallization techniques for plating laser projection patterned (LPP) substrates (among other electronic substrates) are needed that control costs, manufacturing time, and potential damage to the substrate.

BRIEF DESCRIPTION OF THE DRAWINGS

The present invention is illustrated by way of example and not limitation in the figures of the accompanying drawings in which like references indicate similar elements, and in which.

DETAILED DESCRIPTION

In the following description, for purposes of explanation, numerous specific details are set forth in order to provide a thorough understanding of the invention. It will be apparent, however, to one skilled in the art that embodiments of the invention can be practiced without these specific details. In other instances, structures and devices are shown in block diagram form in order to avoid obscuring the invention.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

Figure 1:
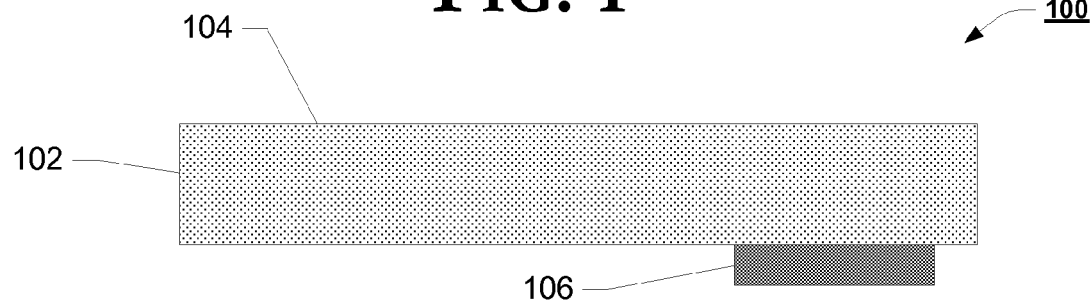
FIG. 1 is a graphical illustration of a cross-sectional view of a partially formed IC package substrate, in accordance with one example embodiment of the invention.

FIG. 1 is a graphical illustration of a cross-sectional view of a partially formed IC package substrate, in accordance with one example embodiment of the invention. In accordance with the illustrated example embodiment, package substrate 100 includes one or more of dielectric layer 102, surface 104, and pad 106.

Dielectric layer 102 represents material such as epoxy resin that has been built on pad 106 (and potentially other layers not shown) as part of a build-up process. Pad 106 may be a layer of copper.

Figure 2:
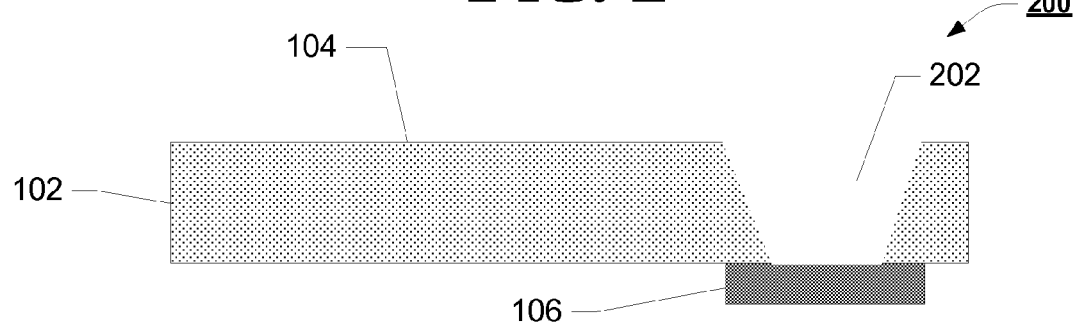
FIG. 2 is a graphical illustration of a cross-sectional view of a partially formed IC package substrate, in accordance with one example embodiment of the invention.

FIG. 2 is a graphical illustration of a cross-sectional view of a partially formed IC package substrate, in accordance with one example embodiment of the invention. As shown in package substrate 200, via 202 has been created from surface 104 of dielectric layer 102 down to pad 106, exposing pad 106. In one embodiment laser drilling with $CO_2$ is used to drill dielectric layer 102 forming via 202 Alternatively any different laser may be used to drill the microvia in the substrate. For instance, an excimer or UV YAG type laser may be substituted for the CO2 laser drilling process. In one embodiment, via 202 is cleared of any debris by desmear techniques.

Figure 3:
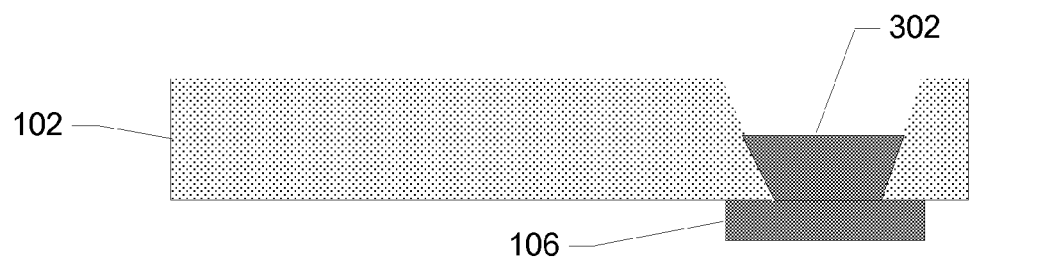
FIG. 3 is a graphical illustration of a cross-sectional view of a partially formed IC package substrate, in accordance with one example embodiment of the invention.

FIG. 3 is a graphical illustration of a cross-sectional view of a partially formed IC package substrate, in accordance with one example embodiment of the invention. As shown in package substrate 300, partially filled via 302 is created through electroless plating of dielectric layer 102 on top of pad 106. In one embodiment, copper electroless plating on copper pad 106 is time controlled so that partially filled via 302 will reach a predetermined thickness, to be described more fully hereinafter.

Figure 4:
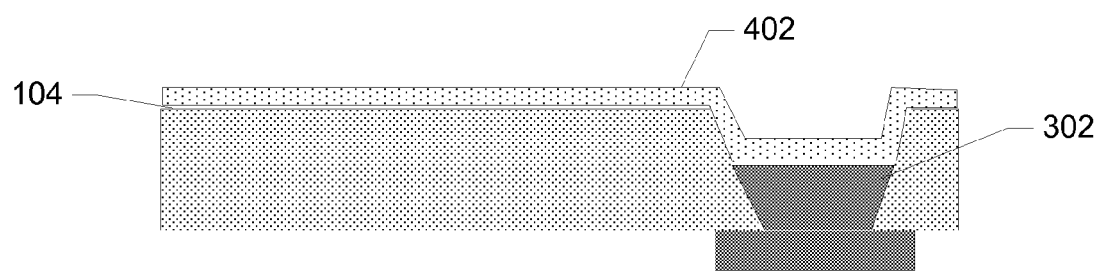
FIG. 4 is a graphical illustration of a cross-sectional view of a partially formed IC package substrate, in accordance with one example embodiment of the invention.

FIG. 4 is a graphical illustration of a cross-sectional view of a partially formed IC package substrate, in accordance with one example embodiment of the invention. As shown in package substrate 400, film 402 has been deposited on surface 104 and partially filled via 302. In one embodiment, film 402 is designed to prevent the seeding of an electroless plating catalyst. Film 402 may be made of a material with negligible diffusion of charged species across the membrane and hence forming a barrier for ionic palladium seeding on the epoxy surface. In one embodiment, film 402 comprises alternating layers of oppositely charged polyelectrolytes which are assembled up to a sufficient number of layer pairs to form an effective barrier against charged catalyst diffusion or penetration. The minimum required thickness, which is a function of the number of layers, is experimentally determined. In one embodiment, film 402 comprises about 10 layer pairs (20 layers) of polyallylamine hydrochloride (PAH), a positively charged polyelectrolyte that is pH sensitive (the total ionic charge of the polymer depends on the pH value) and a negatively charged polyelectrolyte, polystyrene sulfonate (PSS). Such a combination of polyelectrolytes is known to deter ionic diffusion across the Polyelectrolyte membrane, as such, any other polyelectrolyte pair with similar charge transport properties may be utilized. In one embodiment, deposition of film 402 is done by dipping package substrate 400 in a polyelectrolyte solution of a specific concentration and pH, with water rinses, or buffer solution rinses in between oppositely charged polymer depositions. In another embodiment, deposition of film 402 is done by spraying the polymers on package substrate 400 (with water or buffer spraying done in between polymer spraying steps). In another embodiment, film 402 may be a laminated polymer film of any nature that resists seeding, such as solder resist-type material. In another embodiment, film 402 may be an acrylate-based polymer film.

Figure 5:
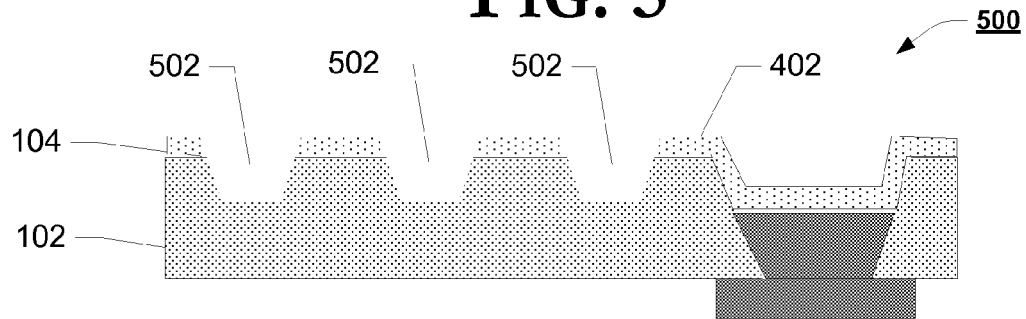
FIG. 5 is a graphical illustration of a cross-sectional view of a partially formed IC package substrate, in accordance with one example embodiment of the invention.

FIG. 5 is a graphical illustration of a cross-sectional view of a partially formed IC package substrate, in accordance with one example embodiment of the invention. As shown in package substrate 500, laser projection patterning is utilized to ablate material from film 402 and from surface 104 of dielectric layer 102 simultaneously forming trenches 502. In one embodiment, desmear for trenches 502 is not necessary due to the fact that laser ablation by excimer laser produces very little residue.

Figure 6:
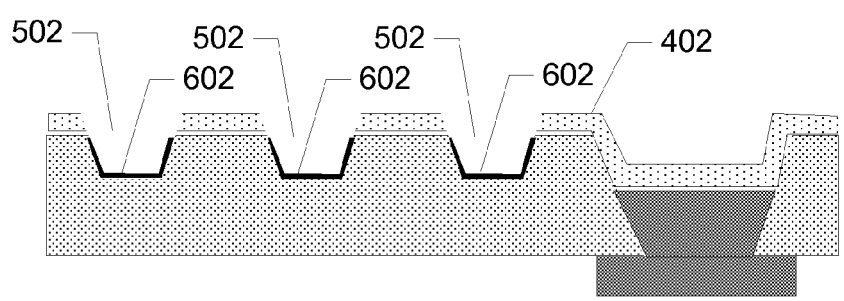
FIG. 6 is a graphical illustration of a cross-sectional view of a partially formed IC package substrate, in accordance with one example embodiment of the invention.

FIG. 6 is a graphical illustration of a cross-sectional view of a partially formed IC package substrate, in accordance with one example embodiment of the invention. As shown in package substrate 600, seeding has resulted in catalyst 602 resident in trenches 502, but not on film 402. In one embodiment, catalyst 602 is an ionic palladium or charged colloidal palladium catalyst and the ionic charge diffusion barrier properties of film 402 prevents palladium seeding.

Figure 7:
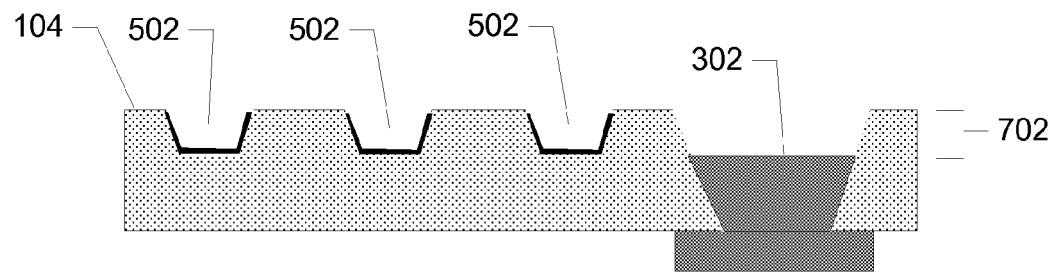
FIG. 7 is a graphical illustration of a cross-sectional view of a partially formed IC package substrate, in accordance with one example embodiment of the invention.

FIG. 7 is a graphical illustration of a cross-sectional view of a partially formed IC package substrate, in accordance with one example embodiment of the invention. As shown in package substrate 700, film 402 has been stripped from surface 104 and partially filled via 302. In one embodiment, an alkaline bath, perhaps containing NaOH as one of the constituents, is used to strip PAH/PSS multilayers of film 402 due to deprotonation of the PAH polymer. In another embodiment, a long base dip is used to remove solder resist-type material of film 402. Depth 702 represents a substantially equivalent depth below surface 104 of trenches 502 and partially filled via 302. Depth 702 may be predetermined so that subsequent electroless plating will fill trenches 502 and partially filled via 302 at substantially the same time.

Figure 8:
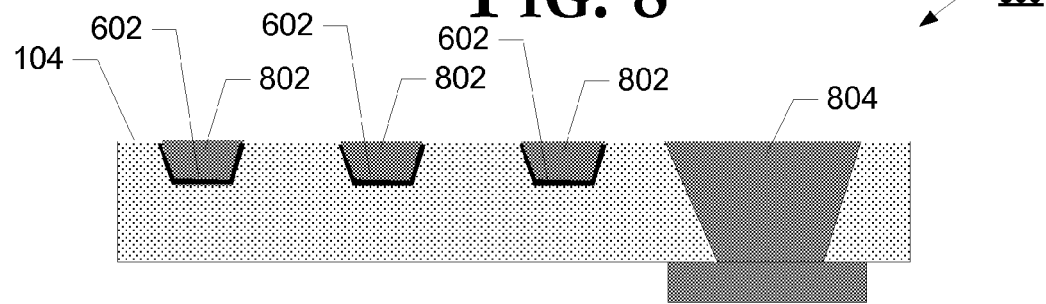
FIG. 8 is a graphical illustration of a cross-sectional view of a partially formed IC package substrate, in accordance with one example embodiment of the invention.

FIG. 8 is a graphical illustration of a cross-sectional view of a partially formed IC package substrate, in accordance with one example embodiment of the invention. As shown in package substrate 800, electroless plating on catalyst 602 and partially filled via 302 has formed traces 802 and filled via 804. In one embodiment, copper electroless plating fills trenches 502 and partially filled via 302 substantially even with surface 104 without the need for planarization.

In one embodiment, package substrate 800 is coupled on surface 104 with an integrated circuit die such as a flip chip silicon die. In another embodiment, surface 104 is laminated with another dielectric layer as part of a continued build-up process.

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form.

Many of the methods are described in their most basic form but operations can be added to or deleted from any of the methods and information can be added or subtracted from any of the described messages without departing from the basic scope of the present invention. Any number of variations of the inventive concept is anticipated within the scope and spirit of the present invention. In this regard, the particular illustrated example embodiments are not provided to limit the invention but merely to illustrate it. Thus, the scope of the present invention is not to be determined by the specific examples provided above but only by the plain language of the following claims.

What is claimed is:

1. A method comprising:
    laser drilling a surface of a substrate to form vias to exposed pads;
    electroless plating the substrate surface to partially fill the vias;
    forming a plurality of layer pairs of polyallylamine hydrochloride (PAH) and polystyrene sulfonate (PSS) on the surface of the substrate, the film designed to prevent palladium seeding;
    laser ablating the surface of the substrate through the polyelectrolyte film to form trenches;
    seeding the surface of the substrate with ionic palladium; and
    dipping the substrate in an NaOH-based bath to strip the PAH/PSS multilayers.

2. The method of claim 1, wherein the trenches are formed to a depth substantially equivalent to a depth below the surface of the substrate of the partially filled vias.

3. The method of claim 1, further comprising desmearing the substrate surface to remove debris prior to electroless plating the substrate surface to partially fill the vias.

4. The method of claim 1, further comprising electroless copper plating the substrate until the trenches and vias are substantially filled to the substrate surface.

5. A method comprising:
    laser drilling a surface of a substrate to form vias to exposed pads;
    electroless plating the substrate surface to partially fill the vias;
    forming a polyelectrolyte film on the surface of the substrate, the film designed to prevent palladium seeding;
    laser ablating the surface of the substrate through the polyelectrolyte film to form trenches;
    seeding the surface of the substrate with ionic palladium;
    dipping the substrate in an NaOH-based bath to strip the polyelectrolyte film; and
    electroless copper plating the substrate until the trenches and vias are substantially filled to the substrate surface.

6. The method of claim 5, further comprising desmearing the substrate surface to remove debris prior to electroless plating the substrate surface to partially fill the vias.

7. The method of claim 5, wherein the trenches are formed to a depth substantially equivalent to a depth below the surface of the substrate of the partially filled vias.

8. The method of claim 5, wherein the polyelectrolyte film comprises layer pairs of polyallylamine hydrochloride (PAH) and polystyrene sulfonate (PSS).

9. The method of claim 8, wherein layer pairs comprise approximately twenty layer pairs of PAH/PSS.

* * * * *